United States Patent
Neal et al.

(10) Patent No.: US 6,514,090 B1
(45) Date of Patent: Feb. 4, 2003

(54) METHOD AND APPARATUS FOR HIGH SPEED DIFFERENTIAL SIGNALING, EMPLOYING SPLIT PIN CONNECTORS AND SPLIT VIA TECHNOLOGY

(75) Inventors: Dan M. Neal, Round Rock, TX (US); Paul Clouser, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 509 days.

(21) Appl. No.: 09/069,700

(22) Filed: Apr. 29, 1998

(51) Int. Cl.[7] .......................... H01R 12/00; H01R 9/22; H01R 13/73; H05K 1/00
(52) U.S. Cl. .......................................... 439/75; 439/931
(58) Field of Search ............................ 439/75, 931, 78

(56) References Cited

U.S. PATENT DOCUMENTS

| | | | |
|---|---|---|---|
| 3,148,356 A | * 9/1964 | Hedden, Jr. | |
| 4,303,292 A | 12/1981 | McNeel | 339/45 M |
| 4,810,209 A | 3/1989 | Punako et al. | 438/589 |
| 4,838,800 A | * 6/1989 | Lynch | 438/78 |
| 5,015,207 A | * 5/1991 | Koepke | 439/886 |
| 5,133,669 A | * 7/1992 | Barnhouse et al. | 439/78 |
| 5,320,549 A | 6/1994 | Schempp et al. | 439/246 |
| 5,460,533 A | 10/1995 | Broeksteeg et al. | 439/101 |
| 5,574,441 A | 11/1996 | Roes et al. | 340/870.31 |
| 5,590,029 A | * 12/1996 | Estes | 361/760 |
| 5,612,684 A | 3/1997 | Kelly et al. | 340/870.31 |
| 5,825,084 A | * 10/1998 | Lau et al. | 257/700 |

* cited by examiner

Primary Examiner—Lynn D. Feild
Assistant Examiner—Chandrika Prasad
(74) Attorney, Agent, or Firm—Mark E. McBurney; Paul Kraft

(57) ABSTRACT

The present invention relates to an apparatus and method for enhancing the differential signaling speed performance of a PCI bus within a data processing system. In particular it involves the connectors employed with PCI bus architecture. The present invention involves providing improved connectors employed in a PCI bus architecture. These are Split Pin and Split Via connectors which provide significantly higher frequency and higher frequency capability to the board level.

29 Claims, 7 Drawing Sheets

PRESENT INVENTION

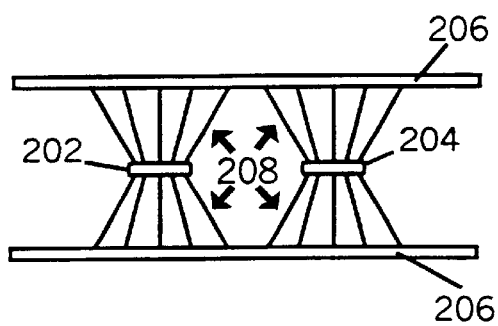
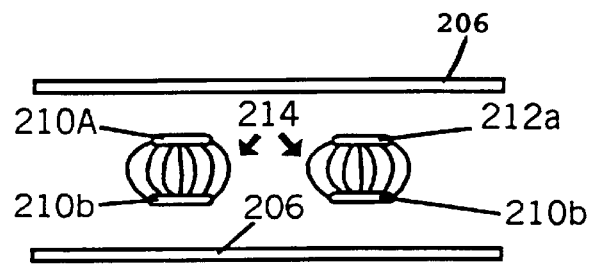
FIG. 2A
(PRIOR ART)
FIG. 2B
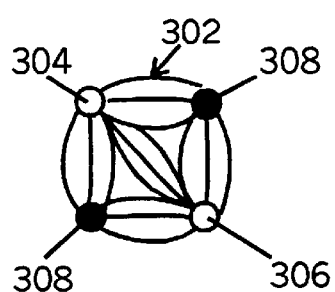
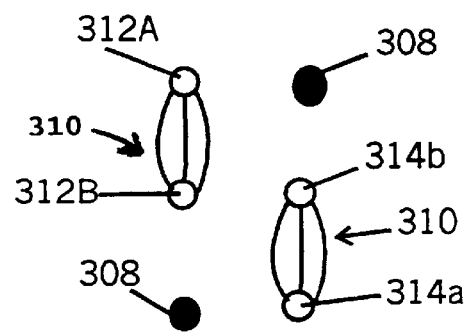
FIG. 3A
(PRIOR ART)
FIG. 3B

PRESENT INVENTION

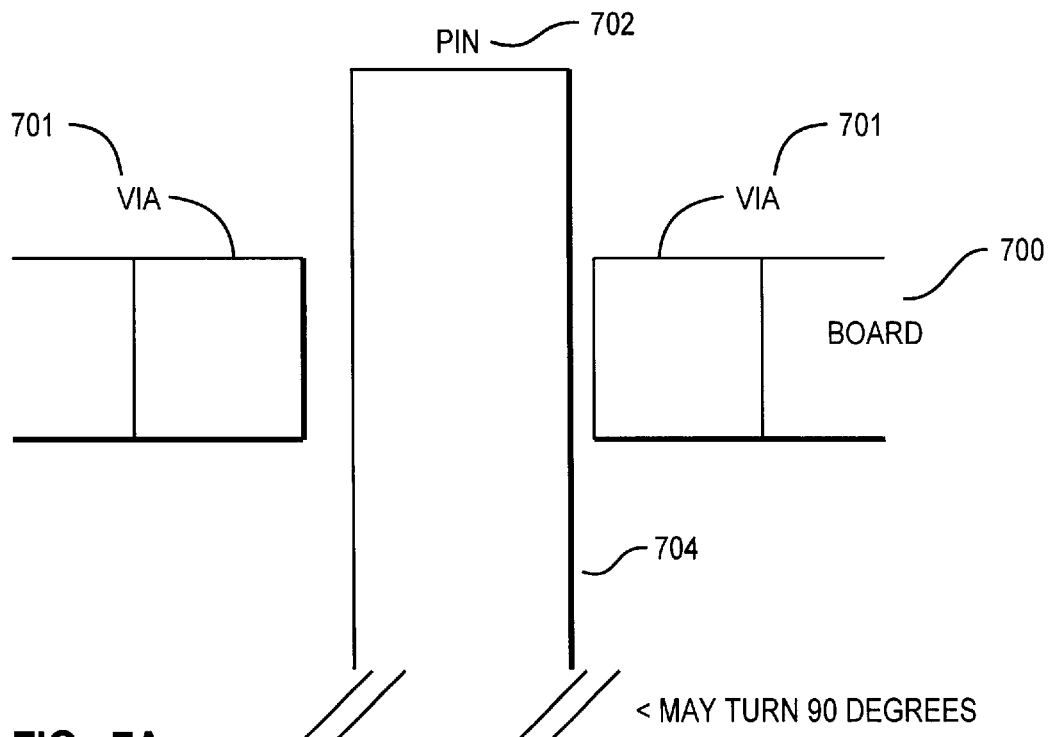
FIG. 7A
PRIOR ART
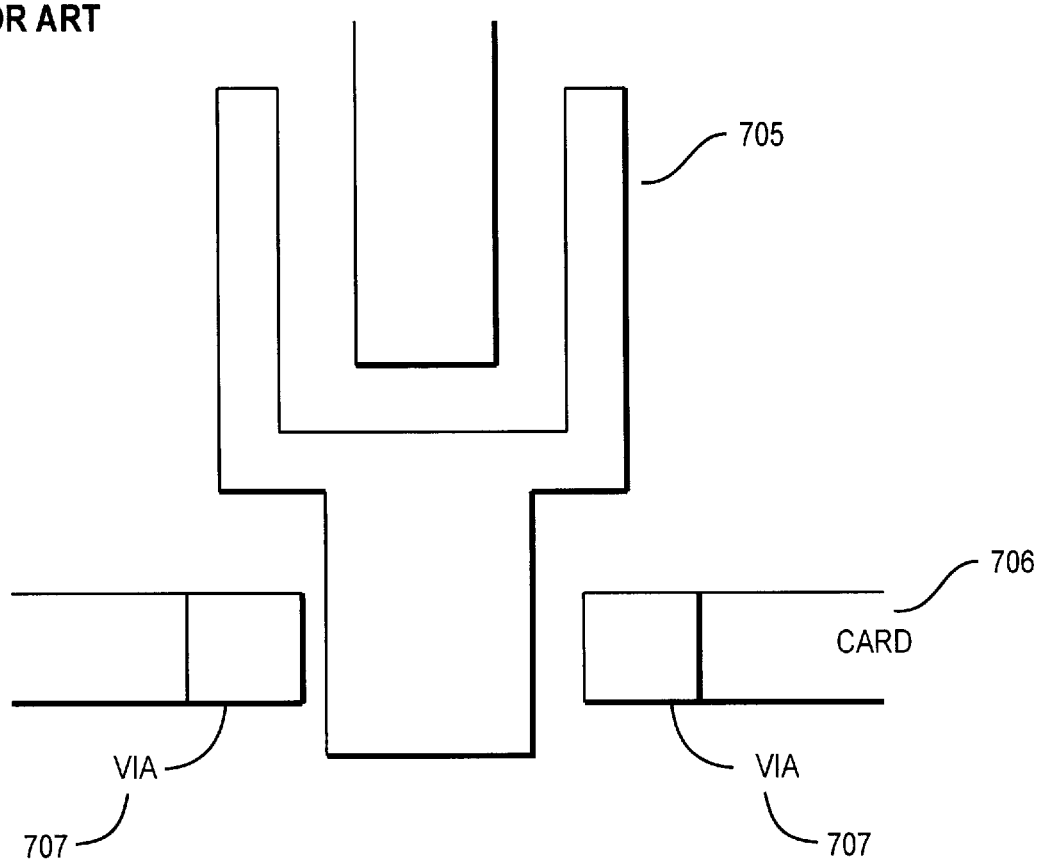

PRESENT INVENTION

METHOD AND APPARATUS FOR HIGH SPEED DIFFERENTIAL SIGNALING, EMPLOYING SPLIT PIN CONNECTORS AND SPLIT VIA TECHNOLOGY

RELATED APPLICATIONS

The present invention is related to the subject matter of the following commonly assigned copending United States patent applications: "DRIVER/RECEIVER CIRCUITRY FOR ENHANCED PCI WITH DIFFERENTIAL SIGNALING", Ser. No. 08/872,823, filed Jun. 11, 1997; "NEW CONNECTOR FOR HIGH PERFORMANCE PCI WITH DIFFERENTIAL SIGNALING", Ser. No. 08/873,347, filed Jun. 11, 1997; and "ENHANCED HIGH PERFORMANCE PCI" Ser. No. 08/819,185 filed Mar. 17, 1997.

The content of the above-referenced copending applications is incorporated herein by reference.

TECHNICAL FIELD

The present invention relates in general to bus architectures in data processing systems and in particular to connectors employed with PCI bus architecture. Still more particularly, the present invention relates to providing an improved connector to be employed in a PCI bus architecture utilizing differential signaling.

Even more specifically, the present invention describes Split Pin connector technology which provides significantly higher frequency and higher frequency capability to the board level; resulting from the fact that the Split Pin and Split Via halves are closer together.

BACKGROUND OF THE INVENTION

Data processing systems typically experience data bottlenecks under older input/output (I/O) standard architectures, such as the Industry Standard Architecture (ISA) and Extended Industry Standard Architecture (EISA). These bottlenecks arise when data transfers are unable to keep pace with the requirements of a processing unit or other component within the data processing system. Alternative I/O architectures have been developed to eliminate such bottlenecks by providing higher bandwidth buses. One such alternative is the peripheral component interconnect (PCI) local bus, a high performance 32-bit or 64-bit bus with multiplexed address and data lines. The mechanical, electrical and operational characteristics for the current PCI local bus standard may be found in PCI Local Bus Specifications, Revision 2.1 ("the current PCI specifications"), available from the PCI Special Interest Group in Portland, Oreg. The current PCI specifications and/or variants are expected to be employed in data processing systems for a considerable time into the future.

The PCI local bus specifications provide a processor independent interface to add-on boards, also commonly referred to as expansion cards or adaptors. However, because of AC switching characteristic limitations, a PCI bus is typically limited in both data transfer rate and fan-out (number of adaptor slots supported). Data transfer rate and fan-out in a PCI bus are interdependent such that achieving an increase in one generally results in a decrease in the other. The current 33 MHz 64-bit PCI architecture definition provides a peak data transfer rate of 264 M/s and supports up to four slots per PCI I/O bus when operated at 33 MHz. This data rate is slow for many performance adaptors under contemporary workstation requirements. The current 66 MHz PCI architecture definition provides a peak data transfer rate of 528 M/s, but only supports up to two slots per PCI I/O bus when operated at 66 MHz. This fan-out is extremely restrictive, limiting the usefulness of the 66 MHz PCI architecture.

A high performance, general purpose parallel I/O bus similar to PCI, but with better performance and fan-out than provided by the current 66 MHz PCI definition, may be provided. The enhanced bus architecture builds upon the current 66 MHz PCI architecture but is not backward-compatible with existing PCI bus architecture specifications since the connectors employed for the existing PCI bus architecture cannot be employed for the enhanced bus architecture. It would, therefore, be desirable to provide connectors supporting the enhanced architecture.

SUMMARY OF THE INVENTION

It is, therefore, one objective of the present invention to provide an improved bus architecture enabling higher frequency and performance capability for data processing. It is yet another objective of the present invention to provide an improved connector employed with the enhanced bus architecture described, enabling higher frequency and performance capability.

Yet another object of the present invention to provide an improved connector to be employed in an enhanced bus architecture utilizing differential signaling. The connector may include both a 32-bit and a 64-bit connector. The foregoing objects are achieved as is now described.

There is a need for a higher frequency performance electrical connector that maintains the high density of present day connectors such as D-Shell 9 or 25 pin, with 2 mm or 0.100 inch center pin density connectors. Any standard connector currently can be made into a 500–1000 MHz or higher clock-rate data connector with the system of the current invention.

Specifically, the present invention is related to a system for connecting signal pins between two PCB's. The various pins in the connector are typically separated by 0.100 inches. The conventional method of connecting differential signal pairs between two PCB's uses two pins and each pin would typically be separated by 0.100 inches.

The present invention provides a modified pin that can be used to replace the pin in a standard connector. This modified pin ("Split Pin") will connect a differential signal pair on one printed circuit board ("PCB"), cable or other transmission medium to its mating differential signal pair on a second PCB, cable or other transmission medium. This concept is called differential pin capability.

Still another object of the present invention, to provide an improved connector to be employed in an enhanced bus architecture utilizing differential signaling connectors, includes the use of both a 32-bit and a 64-bit connector and Split Vias.

The foregoing objects are achieved as is now described. The above, as well as additional objects, features and advantages of the present invention will become apparent in the following detailed written description.

BRIEF DESCRIPTION OF THE DRAWINGS

The novel features believed characteristic of the invention are set forth in the appended claims. The invention itself, however, as well as the preferred mode of use, further objects and advantages thereof, will best be understood by reference to the following detailed description of an illustrative embodiment when read in conjunction with the accompanying drawings, wherein:

FIGS. 2A and 2B are comparative diagrams of signal lines on a back plane or adaptor card within a data processing system;

FIGS. 3A and 3B depict comparative diagrams of pin layouts for an adaptor card connector within a data processing system;

FIG. 7a represents the standard via with a standard wire trace soldered to the via board.

DETAILED DESCRIPTION OF THE PREFERRED EMBODIMENT

As noted above, the present invention relates to bus architectures in data processing systems and, in particular, to connectors employed with PCI bus architecture. Still more particularly, the present invention relates to providing an improved connector to be employed in a PCI bus architecture utilizing differential signaling.

Specifically, the present invention describes Split Pin connector technology which provides significantly higher frequency and higher frequency capability to the board level, since the Split Pin halves are closer together.

The following description is presented to enable one of ordinary skill in the art to make and use this invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
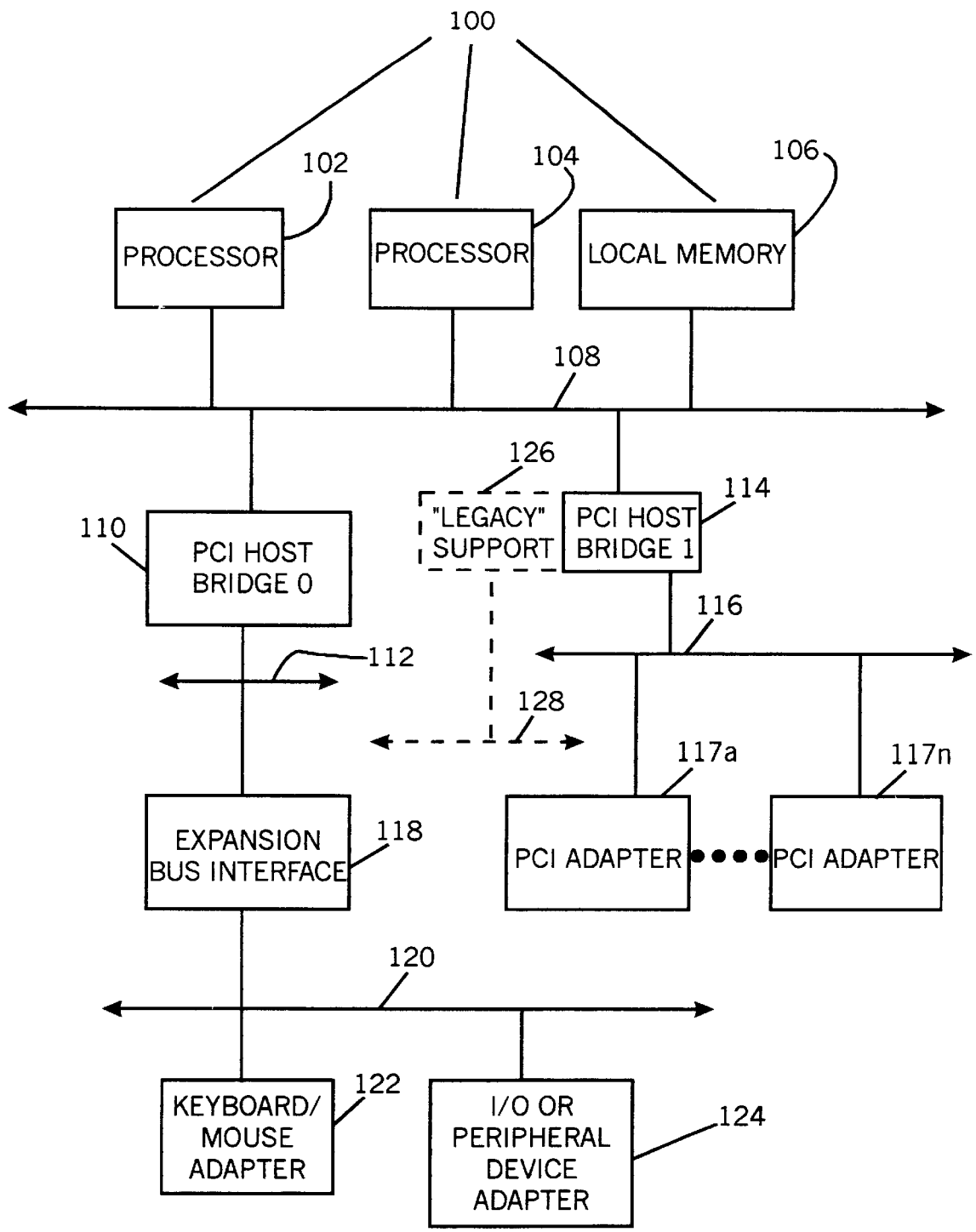
FIG. 1 depicts a data processing system in which a preferred embodiment of the present invention may be implemented.

With reference now to the figures and, in particular, with reference to FIG. 1, a block diagram of the data processing system in which the preferred embodiment of the present invention may be implemented as depicted. Data processing system 100 may be, for example, an RISC System/6000™ system, a product of the International Business Machines Corporation of Armonk, N.Y. Data processing system 100 thus includes processors 102 and 104 and local memory 106 connected to system bus 108. Also connected to system bus 108 is a host bridge ("PCI Host Bridge") 110, which provides an interface between system bus 108 and PCI bus 112. Additional host bridges, such as host bridge ("PCI Host Bridge 1") 114, provides similar interfaces between system bus 108 and PCI buses. Host Bridge 114 provide an interface to PCI bus 116. At least one PCI adaptor card 117a–115n may connect to PCI bus 116.

Connected to PCI bus 112 are PCI adaptor cards and/or expansion bus bridge 118, which provide an interface between PCI bus 112 and expansion card 120. Expansion bus 120 may be an ISA or EISA bus and provides slots for connection of input devices such as keyboard/mouse adaptor 122. Other I/O or peripheral devices, such as a CD-ROM, may also be connected to expansion bus 120 through device adaptor 124.

Those skilled in the art will appreciate that the hardware depicted in FIG. 1 may vary. For example, other peripheral devices such as optical disk drives and the like also may be utilized in addition to or in place of the hardware depicted. The example depicted is not meant to imply architectural limitations. Any data processing system which utilizes a PCI bus architecture or other bus architecture may also employ the present invention.

In accordance with the preferred embodiment of the present invention, at least one host bridge and PCI bus pair depicted in FIG. 1 implements an enhanced PCI bus architecture. For example, host bridge 114 and PCI bus 116 may implement the enhanced PCI bus architecture (enhanced PCI) of the present invention, while host bridge 110 and PCI bus 112 may implement a bus conforming to the existing PCI bus architecture specifications ("legacy"). The enhanced PCI bus 116 supports existing PCX protocols and signal ordering rules. Functional operations, such as Retry, of the existing PCI bus architecture are also supported. The enhanced PCI bus architecture supports a 32-bit and 64-bit Address/Data bus.

While supporting much of the existing PCI bus architecture protocols, the enhanced PCI bus architecture employs differential signaling on the host bridge, PCI bus, and devices or adaptor cards connected to the enhanced PCI bus. Thus, two signal lines are required for each signal in the enhanced PCI bus architecture. A new connector for the enhanced PCI architecture must also be defined. Adding the differential signaling environment should be transparent to the PCI protocol, and an increased frequency may be achieved, scalable up to a maximum frequency dependant on the driver/receiver technology selected. When operating at a significantly higher frequency, PCI timing requirements must be adjusted based on the driver/receiver technology employed and actual maximum frequency selected.

Because the existing or "legacy" PCI protocols are supported, host bridge 116 for enhanced PCI bus 116 may provide integral legacy support 126 for a legacy PCI bus 128. The same circuits may be employed for many operations required of host bridge 114/126, with the exception of the receiver and output driver stages to the separate buses 116 and 128. Thus, a single enhanced/legacy PCI bridge 114/126 may support connections to both enhanced and legacy PCI devices, although on separate buses. Alternatively, a separate bridge connected to enhanced PCI bus 116 may provide bridge support connection to legacy PCI devices.

Referring to FIGS. 2A and 2B, comparative diagrams of signal lines on a back plane or adaptor card within a data processing system are illustrated. FIG. 2A illustrates the effect of employing conventional signal lines. Conventional single-ended signal detection currently employed by the PCI bus architecture requires detection of a signal level (high or low) with respect to ground. Capacitive cross-coupling between the signal lines 202 and 204 and ground 206 results in electromagnetic field 208. Energy is thus expelled during the transfer of information on the bus for charging and discharging bus capacitances. Signal lines may also cross-couple or interfere between each other, creating noise problems.

FIG. 2B illustrates a signal line pair arrangement for a back plane or adaptor card within an enhanced PCI bus in accordance with a preferred embodiment of the present invention. The signal line arrangement illustrated is applicable to PCI based systems, as well as to other systems. Rather than conventional single-ended signal lines presently used in PCI bus architectures, differential signal line pairs 210a–210b and 212a–212b are employed. A differential signal requires two lines per signal and information is transferred by detecting either a polarity or a magnitude of a voltage difference between the two signal lines.

Signal line pairs 210a–210b and 212a–212b preferably transmit signals which are equal in magnitude but opposite in polarity. That is, if signal line 210a carries a signal of +1V, signal 210b simultaneously carries a signal of −1V. As a result, the electromagnetic field between a signal pair, such as signal line pair 210a–210b and ground 206 is negligible, since the electromagnetic field between one line 210a and ground 206 cancels the electromagnetic field between the other signal line 210b and ground 206. Only the electromagnetic field 214 between signal lines in a signal line pair—between signal lines 210a and 210b, for example—remains significant. As shown, the electromagnetic field formed between differential signal lines in a signal line pair is much smaller and more localized than the electromagnetic field between a conventional single-ended signal line and ground. Therefore, when compared to the conventional signaling environment, a much lower transition is required to transfer information. Less energy is expended on the bus charging and discharging capacitance during transfer of information. Moreover, utilizing differential signaling improves noise immunity and allows higher transfer rates to be achieved.

As much as possible, each of the differential signal line pairs 210a–201b and 212a–212b are routed together in close proximity with each other on the motherboard and add-in adaptor cards employed in the data processing system. This assures that the differential signaling benefits—the cancelling effect of cross-coupling between signal lines and ground or other signal lines—are realized on the motherboard and I/O cards. However, routing signal line pairs together precludes backward-compatibility with legacy PCI bus connectors, which do not include physical space within the connector definition for the additional signal lines required. By utilizing smaller voltages for differential signaling, lower voltage chip technologies may be employed, which also contributes to higher frequency capability.

With reference to FIGS. 3A and 3B, comparative diagrams of pin layouts for an adaptor card connector within a data processing system are depicted. FIG. 3A depicts a conventional signal pin arrangement. The electromagnetic field 302 between signal pins 304 and 306 and ground pins 308 may be substantial, as shown. FIG. 3B depicts a differential signal pair arrangement for an enhanced PCI bus in accordance with a preferred embodiment of the present invention. The connector pin arrangement depicted would be applicable to PCI based systems, as well as other systems. To take advantage of the benefits of differential signaling and for signal quality, each of the two pins forming the differential pair are placed adjacent to each other in the connector. Similar to the signal line arrangement in FIG. 2B, the electromagnetic field 310 between signal pin pairs 312a–312b and 314a–314b is much smaller and more localized than in connectors using conventional signal pin arrangements for PCI bus connections. A connector pin arrangement for legacy PCI bus connections. A connector pin arrangement, as shown, also may allow an enhanced PCI bus cable using twisted pair lines for each signal pair to be 10 feet or longer for PCI bus extension.

Figure 4:
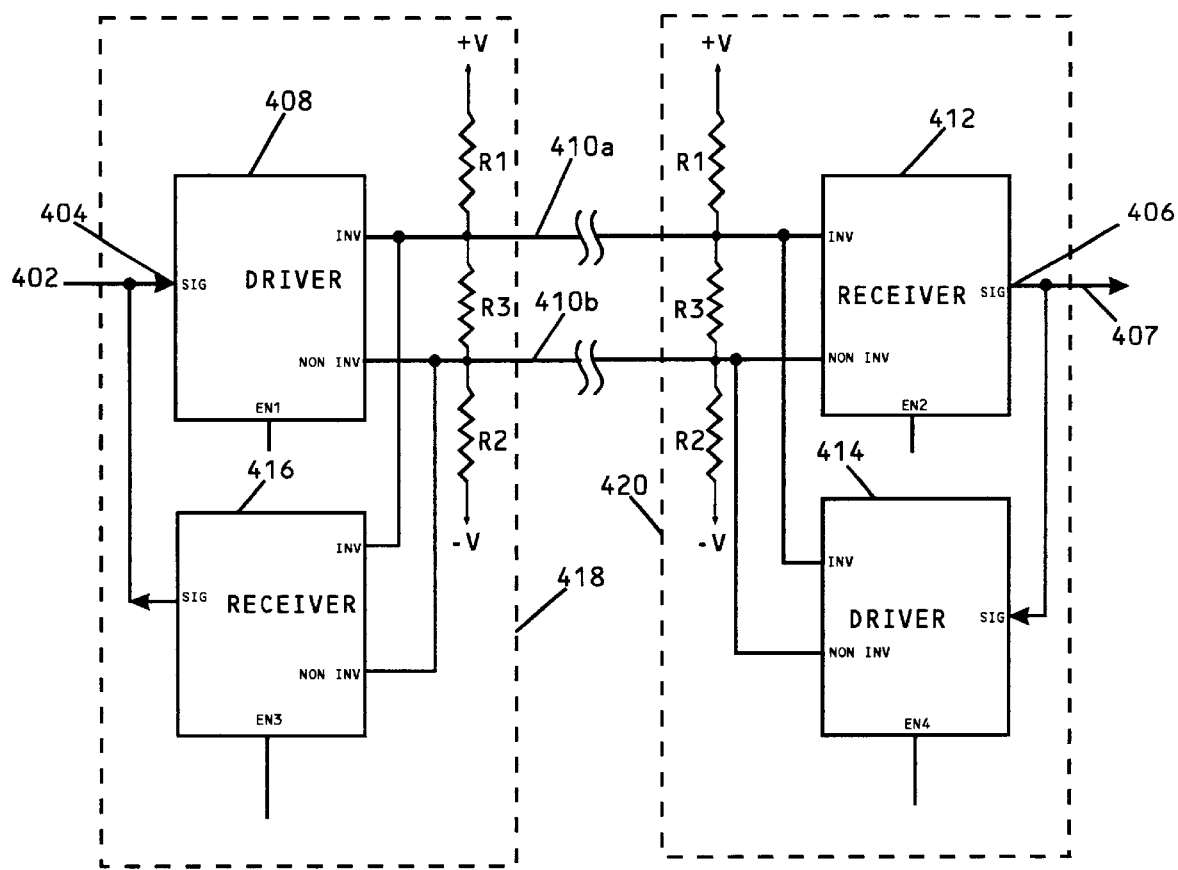
FIG. 4 is a block diagram of a bidirectional signaling net for enhanced PCI bus utilizing differential signaling in accordance with a preferred embodiment of the present invention.

Referring to FIG. 4, a block diagram of a bidirectional signaling net for enhanced PCI bus utilizing differential signaling in accordance with a preferred embodiment of the present invention is illustrated. This type of signaling net may be employed for all Address/Data signal lines in an enhanced PCI bus which required bidirectional capability. Signaling net 402 receives and transmits at an input/output 404 a single-ended signal from an enhanced PCI bus master and/or target. The bus master may be a PCI host bridge or any other PCI device capable of acting as a PCI bus master. Signaling net 407 transmits and receives a single-ended signal from an enhanced PCI bus master and/or target at input/output 406. The bus target may be an adaptor card or any other PCI device serving as a PCI bus target. Both the master and the bus target, according to the invention, Utilize the enhanced PCI bus definition.

Input 404 is connected to single-ended-to-differential driver 408 associated with PCI bus master and/or target, which converts the single-ended signal to a differential signal in accordance with methods known in the art. Driver 408 transmits the differential signal line pair 410a and 410b. The differential signal transmitted may indicate different states in a variety of manners. For example, two different states may be defined by a voltage difference on differential signal line pair 410a–410b which remains constant in magnitude but changes direction, such as when the polarity of the voltage difference is reversed. A first polarity may represent a first state ("High") while the opposite polarity may represent a second state ("Low"). Alternatively, the voltage difference on differential signal line pair 410a–410b may remain constant in direction or polarity, but change in magnitude in opposite directions, with a first magnitude representing a first state and a second magnitude representing a second state. In either case, however, the voltages applied to differential signal line pair 410a–410b should have the same magnitude change but opposite directions with respect to ground, so that the cancelling effect may be achieved.

Differential signal line pair 410a–410b is also connected to receiver 412 associated with the PCI bus master and/or target, which transforms the differential signal to a single-ended signal by methods known in the art. The resulting single-ended signal is transmitted on output 406 to the PCI bus master and/or target. Since bidirectional signaling is required for this example, a second driver 414 associated with the PCI bus target is connected to output 406 and differential signal pair 410a–410b. Driver 414 receives single-ended signals at output 406 from the PCI bus target and transmits a corresponding differential signal on differential signal line pair 410a–410b. A receiver 416, associated with the PCI bus master, is connected to differential signal line pair 410a–410b and input 404, transforming differential signals received to single-ended signals and transmitting the single-ended signals to the PCI bus master.

Drivers 408 and 414 and receivers 412 and 416 each include an enable signal input, preventing the respective devices from transmitting or receiving unless asserted. The signals applied to these enable signal inputs are coordinated to ensure that only one driver is transmitting during a given bus cycle.

In addition to cross-coupling, an additional problem with the conventional single-ended signal lines employed in existing PCI architectures is reflective signaling, which limits the physical length of the PCI bus and thus limits fan-out. Employing balanced load signal lines eliminates reflections and results in single incident signaling. Therefore, each transceiver 418 and 420 comprising a driver/receiver pair associated with either a PCI bus master or PCI bus target includes a resistive load at the connection to differential signal line pair 410a–410b. The resistive load comprises resistance R1 connected between an upper power supply voltage and one differential signal line 410a and resistance R2 connected between and lower power supply voltage and the other differential signal line 401b, and resistance R3 connected between the differential signal lines 410a and 410b. The values of R1, R2 and R3 are selected to ensure that the loads seen by differential signal line pair 410a–410b remain substantially balanced and constant regardless of which transceiver 418 or 420 is transmitting and which is receiving. The driver/receiver pair 408 and 416 optimally would be within the PCI interface chip, such as on an adaptor add-on card. Termination resistors R1, R2 and R3 in transceiver 418 would be located on the motherboard, close to the PCI host bridge in this example. Resistor network R1, R2 and R3 in transceiver 420 would also be on the motherboard located at the end of the PCI bus net.

Figure 5:
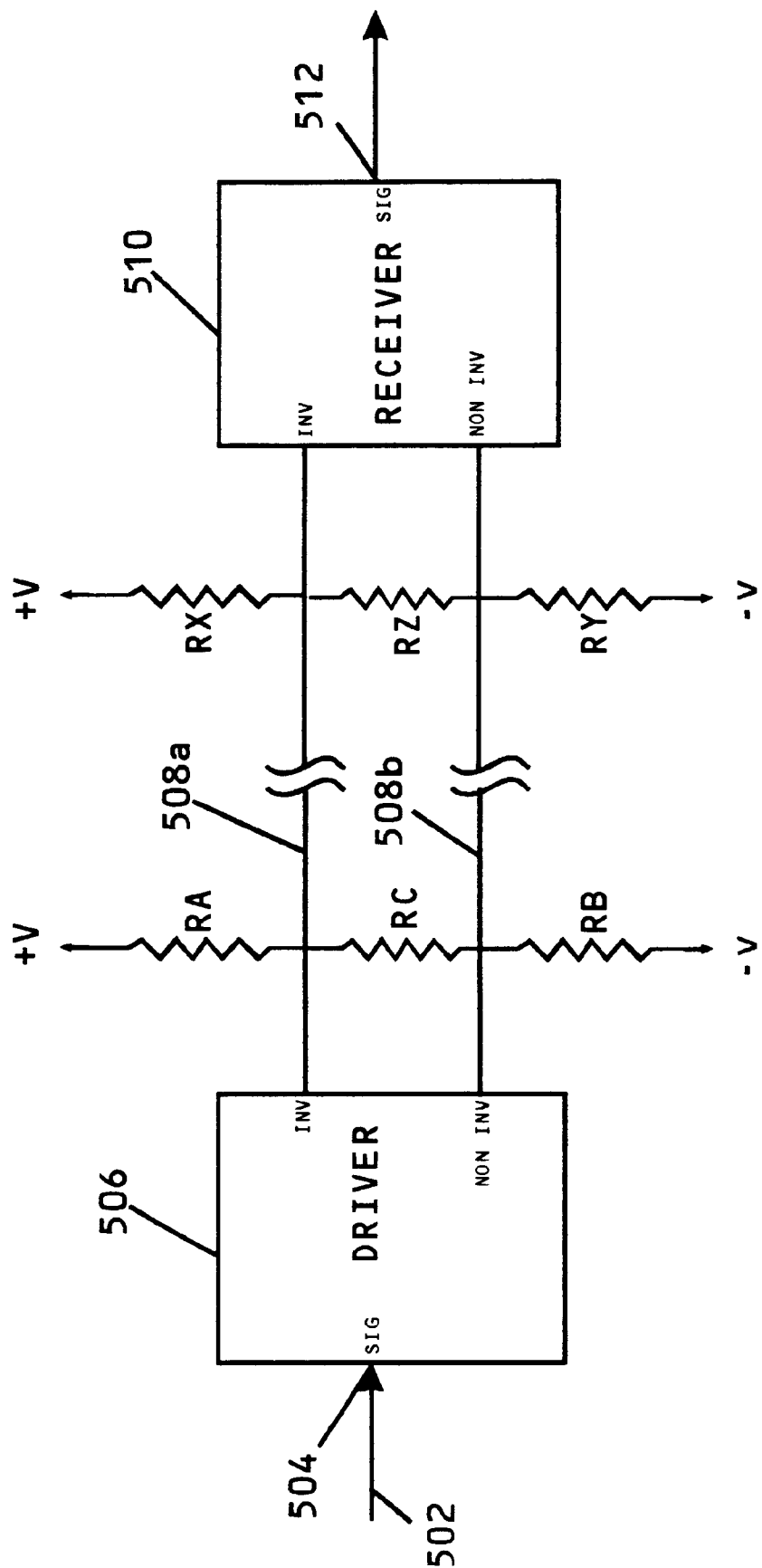
FIG. 5 depicts an alternative signaling net for an enhanced PCI bus utilizing differential signaling in accordance with a preferred embodiment of the present invention.

With reference to FIG. 5, a block diagram of an alternative signalling net for enhanced PCI bus utilizing differential signalling in accordance with the preferred embodiment of the present invention is depicted. This simpler net may be employed for signal lines which do not require bidirectional capability, such as REQ#, GNT#, etc. Signalling net 502 receives single-ended signals from a bus master at input 504 connected to driver 506. Driver 506 transforms the single-ended signals to differential signals and transmits the differential signals on differential signal line pair 508a–508b. Receiver 510 connected to differential signal line pair 508a–508b transforms the differential signals to single-ended signals and transmits the single-ended signals on output 512 to a bus master and/or target.

Resistive loads associated with both driver 506 and receiver 510 ensure that differential signal line pair 508a–508b is connected to a balanced load. This is accomplished at driver 506 by resistance Ra connected between an upper power supply voltage and differential signal line 508a, resistance Rb connected between a lower power supply voltage and differential signal line 508b and resistance Rc connected between differential signal lines 508a and 508b. A similar resistive load configuration is associated with receiver 510, although providing a balanced load at receiver 510 may require that different resistance values Rx, Ry and Rz be employed.

Figure 6A:
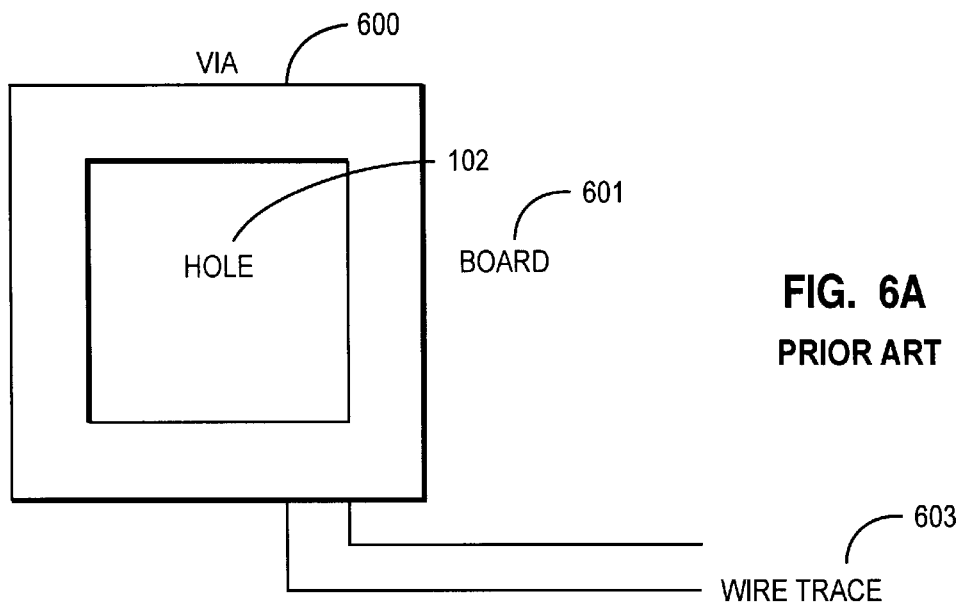
FIG. 6a represents a conventional method for connecting signal pins between two PCB's.

A conventional method of connecting signal pins between two PCB's is illustrated in FIG. 6a. The various pins in the connector are typically separated by 0.100 inches. The conventional method of connecting differential signal pairs between two PCB's is similar to that shown in FIG. 6a but uses two pins instead. Again each pin would typically be separated by 0.100 inches. In FIG. 6a, the Via is noted at 600, the printed circuit board at 601, the hole in the Vias at 602 and the Wire Trace at 603.

Figure 6B:
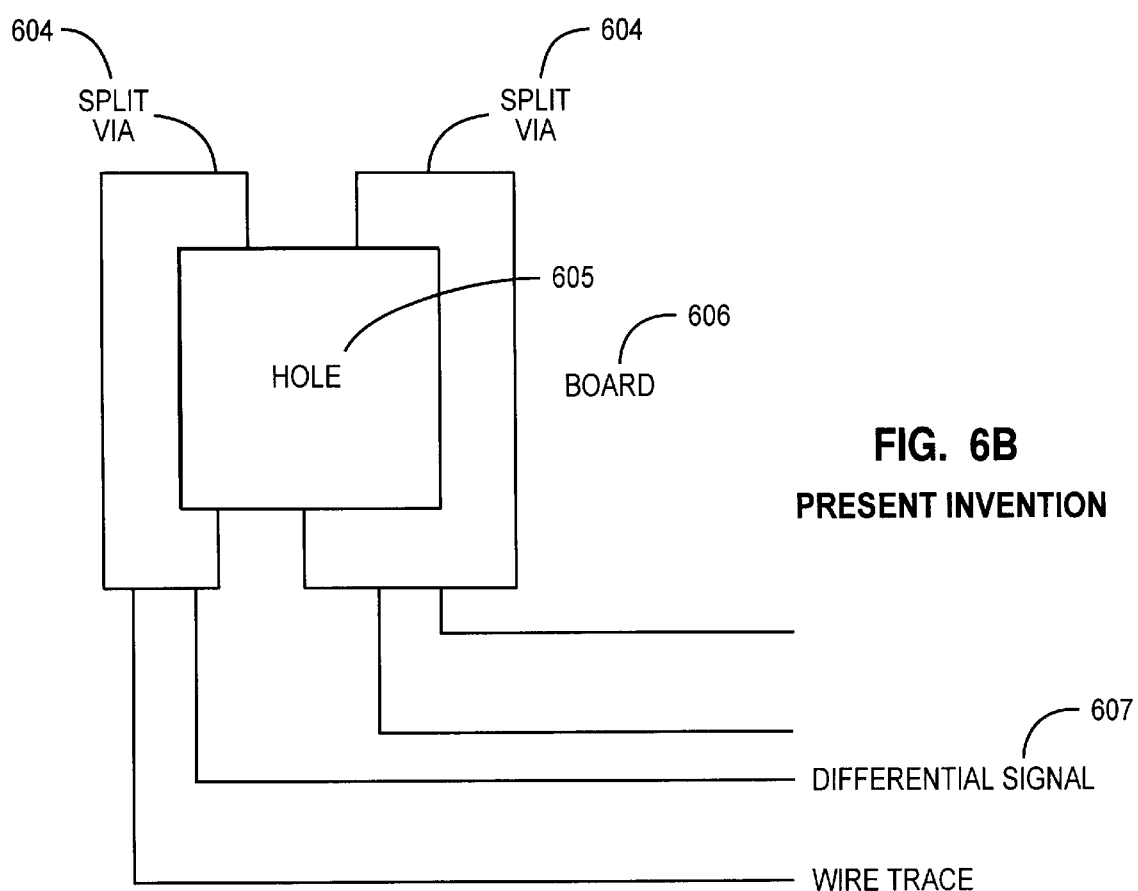
FIG. 6b represents or illustrates the concept of the differential pin capability, representing an example of Split Vias and board wiring for differential signaling.

FIG. 6b conceptually illustrates the Split Via, a major embodiment of this invention. Here we see the Split Vias at 604, the Hole at 605, the Board at 606, the Differential Signal wire traces at 607.

FIG. 7a conceptually illustrates a standard Pin Example. The circuit board is at 700, the standard pin is located at 702, the Via at 701, the connector Mating Male Pin Soldered to the Circuit Board at 704. The connector housing for mating halves is not shown for simplicity 705. The card is shown at 706 and the Via shown at 707.

Figure 7B:
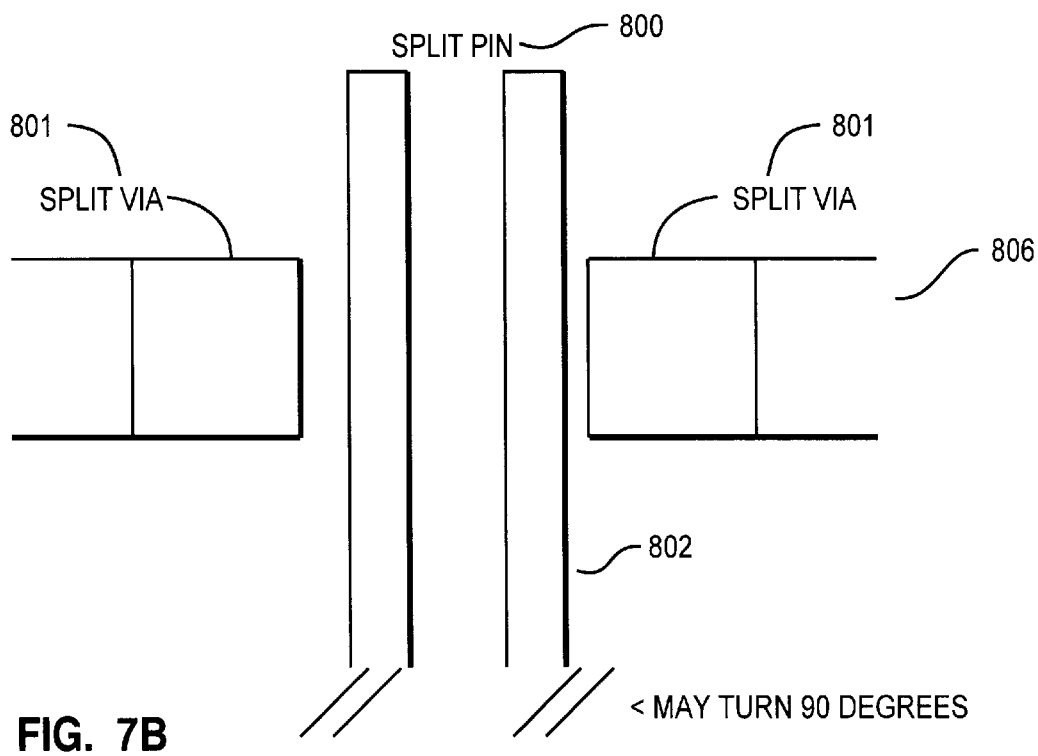
FIG. 7b represents an example of split connector male pin attached to a board with the female pin attached to adaptor card.
Figure 7B:
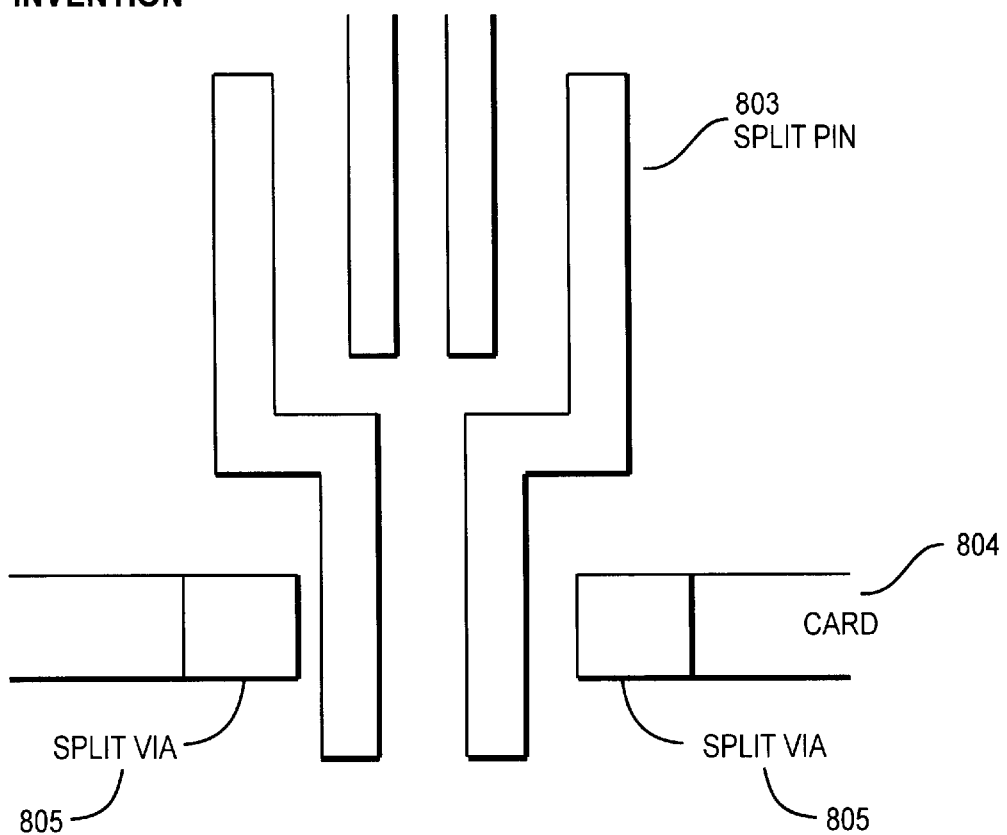

FIG. 7b illustrates the Split Via described in this invention with differential wire traces soldered to the Split Via. The Split Pins shown conceptually in FIG. 7b, would be soldered or press fitted into the Split Via shown in FIG. 7b. Of course the halves of the Split Via would not be electrically connected to each other.

Reviewing the structure of the Split Pin in FIG. 7b, we note the Split Pin at 800, the Split Via at 801 and the circuit board at 806, the mating male Split Pin soldered to the board at 802. A mating female Split Pin soldered to card 804 is located at 803 and Split Via is located at 805. The connector housings for mating halves are not shown for figure simplicity.

A major advantage of the present invention is that since the Split Pin halves are much closer, typically 0.010 inches, than the more conventional pin pair, typically 0.100 inches, a factor of 10 improvement frequency performance can be attained. This improved frequency performance comes about in several of the following ways.

1. Transmission across the Split Pin occurs at a characteristic impedance which can be designed to equal that of the typical impedance which can be designed to equal that of the typical PCB: 50 to 70 ohms. The more conventional dual pin approach yields a characteristic impedance that is 120 to as high as 200 ohms. As data clock speed increases above 100 MHz this mismatch in impedance in the dual pin approach produces signal reflection effects that:
   a) degrade signal transition speed (rise and fall time) by introducing an effective series inductance in the signal path, and
   b) degrade noise margin by contributing to ringing on the signal line.
2. Coupling between pairs of Split Pins will be lower by at least a factor of 10. This will permit a 10 times minimum increase of coupled noise margin.
3. The connector's contribution to ground bounce between PCB's is already decreased significantly just by using differential signal transmission. The tighter coupling between halves of the Split Pins will lower the effective inductance between PCB's. This lowering will further decrease ground bounce. Ground bounce will be reduced even more if the power and ground connections between PCB's are also balanced on Split Pin pairs.

What is said above also applies to the more conventional single-ended method of transmission. That is, the Split Pin connector will also be very effective if one half of the Split Pin is signal and the other is ground return.

Implementation Technology

This invention can be implemented in a manner that does not require a major departure from current technology connectors. For example, the external size and shape of the connector body (including both mating halves) can basically remain unchanged. This is a key strength of this invention. Of course the connector pins will change to include split halves to allow differential signalling. The Split Pins will provide high speed in the form of low loop inductance and low coupling needs. Production of Split Pins is expected to be an independent technology development.

Vias can be generated in a variety of ways, including the standard technology manner. Then they can be split with a broaching or other tool where required for Split Pins.

We claim:

1. A method of enhancing the differential signaling speed performance of a PCI bus, within a data processing system, comprising the steps of:

connecting a differential signal pair to a printed circuit board, cable or other transmission; and replacing the standard solid connectors pins with Split Pin connectors.

2. The method of claim 1 wherein said method further involves connecting said differential signal pair on said printed circuit board, cable or other transmission medium, and mating said differential signal pair with a similar differential signal pair located on another printed circuit board, cable or transmission medium.

3. The method of claim 1 wherein said Split Pin halve connector pairs are an order of magnitude distance closer than solid pin pairs.

4. The method of claim 1 wherein said Split Pin halves are approximately 0.010 inches apart.

5. The method of claim 1 wherein,the frequency supportable is improved by a factor of 10 times.

6. The method of claim 1 wherein the transmission across said Split Pin occurs at an impedance designed to equal 50 to 70 ohms.

7. The method of claim 1 wherein the external size and shape of the connector body, including both mating halves, remain unchanged.

8. An apparatus for enhancing the differential signaling speed performance of a PCI bus, within a data processing system, comprising:

a differential signal pair connected to a printed circuit board, cable or other transmission; and Split Pin connectors replace standard solid connectors pins.

9. The apparatus of claim 8 wherein said apparatus which is connected to said differential signal pair, on said printed circuit board, or cable or other transmission medium, and is mated to a said differential signal pair located on another printed circuit board, cable or transmission medium.

10. The Split Pin apparatus of claim 8, wherein said Split Pin halves are closer than the standard non-Split Pin pair.

11. The Split Pin apparatus of claim 8 wherein said Split Pin halves are one-tenth the distance apart as compared to the current non-split standard pin pair.

12. The Split Pin apparatus of claim 8 wherein the frequency supportable is improved by a factor of a factor of 10 times.

13. The Split Pin apparatus of claim 8 wherein the transmission across the Split Pin occurs at an impedance designed to equal 50 to 70 ohms, which is equal to that of the typical printed circuit board.

14. The Split Pin apparatus of claim 8 wherein the external size and shape of said connector body, including both mating halves, remain essentially unchanged.

15. A data processing system for enhancing the differential signaling speed performance of a PCI bus, within a data processing system, comprising:

a differential signal pair connected to a printed circuit board, cable or other transmission;

Split Pin connectors replace standard solid connectors pins.

16. The system of claim 15 wherein said system further involves connecting said differential signal pair on said printed circuit board, or cable or other transmission medium, and mating said differential signal pair with a similar differential signal pair located on another printed circuit board, cable or transmission medium.

17. The Split Pin system of claim 15 wherein said Split Pin halves are closer than the standard non-Split Pin pair.

18. The Split Pin system of claim 15 wherein said Split Pin halves are one-tenth the distance apart as compared to the current non-split standard pin pair.

19. The Split Pin system of claim 15 wherein the, frequency supportable is improved by a factor of a factor of 10 times.

20. The Split Pin system of claim 15 wherein the transmission across the Split Pin occurs at an impedance designed to equal 50 to 70 ohms, which is equal to that of the typical printed circuit board.

21. The Split Pin system of claim 15 wherein the external size and shape of said connector body, including both mating halves, remain essentially unchanged.

22. A data processing system for enhancing the differential signaling speed performance of a PCI bus, within a data processing system, comprising:

a differential signal pair connected to a printed circuit board, cable or other transmission; and Split Pin connectors and Split Via construction to replace standard solid non-split and non-Split Pin and Vias in said circuit board, cable or other transmission medium connectors.

23. An apparatus for enhancing the differential signaling speed performance of a PCI bus, within a data processing system, comprising:

a differential signal pair connected to a printed circuit board, cable or other transmission; and Split Pin connectors and Split Via construction to replace standard solid non-split and non-Split Pin and Vias in said circuit board, cable or other transmission medium connectors.

24. The apparatus of claim 23 wherein said apparatus, which is connected to said differential signal pair on said printed circuit board, or cable or other transmission medium, and is mated to a said differential signal pair located on another printed circuit board, cable or transmission medium.

25. The Split Pin and Split Via apparatus of claim 23, wherein said Split Pin halves are closer than the standard non-Split Pin and non-Split Via pairs.

26. The Split Pin and Split Via apparatus of claim 23, wherein said Split Pin halves are one-tenth the distance apart as compared to the current non-split standard pin pair.

27. The Split Pin and Split Via apparatus of claim 23 wherein the frequency performance is improved by a factor of a factor of 10 times.

28. The Split Pin and Split Via apparatus of claim 23 wherein the transmission across the Split Pin occurs at an impedance designed to equal 50 to 70 ohms, which is equal to that of the typical printed circuit board.

29. The Split Pin and Split Via apparatus of claim 23 wherein the external size and shape of said connector body, including both mating halves, remain essentially unchanged.

* * * * *